(12) United States Patent
Chen et al.

(10) Patent No.: US 10,826,483 B2
(45) Date of Patent: Nov. 3, 2020

(54) POWER CHIP AND BRIDGE CIRCUIT

(71) Applicant: Delta Electronics (Shanghai) CO., LTD, Shanghai (CN)

(72) Inventors: Yan Chen, Shanghai (CN); Xiaoni Xin, Shanghai (CN); Le Liang, Shanghai (CN); Shouyu Hong, Shanghai (CN); Jianhong Zeng, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 439 days.

(21) Appl. No.: 15/613,424

(22) Filed: Jun. 5, 2017

(65) Prior Publication Data

US 2018/0062638 A1 Mar. 1, 2018

(30) Foreign Application Priority Data

Aug. 26, 2016 (CN) .......................... 2016 1 0744165

(51) Int. Cl.
*H03K 17/16* (2006.01)
*H01L 27/088* (2006.01)
(Continued)

(52) U.S. Cl.
CPC ......... *H03K 17/162* (2013.01); *H01L 23/528* (2013.01); *H01L 27/0629* (2013.01);
(Continued)

(58) Field of Classification Search
CPC .... H03K 17/16; H03K 17/161; H03K 17/162; H03K 17/163; H03K 17/164; H03L 23/52; H03L 23/522; H03L 23/528; H03L 23/5283; H03L 23/5286; H01L 27/02; H01L 27/04; H01L 27/06; H01L 27/0605;
(Continued)

(56) References Cited

U.S. PATENT DOCUMENTS 8,085,553 B1 12/2011 Lacap et al.
2012/0112366 A1* 5/2012 Crebier .......... H01L 21/823481
257/777
(Continued)

FOREIGN PATENT DOCUMENTS

CN 103022022 A 4/2013
CN 103795384 A 5/2014
(Continued)

OTHER PUBLICATIONS

The CN1OA issued Oct. 11,2019 by the CNIPA.

*Primary Examiner* — Diana J. Cheng
(74) *Attorney, Agent, or Firm* — Yunling Ren

(57) ABSTRACT

A power chip and a bridge circuit are disclosed in the present disclosure. The power chip includes a metal region and a wafer region, wherein the power chip further includes: a first power switch, formed in the wafer region; and a second power switch, formed in the wafer region, wherein the first and second power switches constitute an upper bridge arm and a lower bridge arm of a bridge circuit, respectively. At least one of the upper bridge arm and the lower bridge arm includes two or more power switches which are connected in parallel with each other, and the first and second power switches are arranged alternatively along at least one dimension direction.

20 Claims, 22 Drawing Sheets

(51) Int. Cl.
*H01L 23/528* (2006.01)
*H01L 27/06* (2006.01)
*H02M 3/158* (2006.01)

(52) U.S. Cl.
CPC ......... *H01L 27/088* (2013.01); *H02M 3/1588* (2013.01); *Y02B 70/1466* (2013.01)

(58) Field of Classification Search
CPC ............. H01L 27/0611; H01L 27/0617; H01L 27/0629; H01L 27/08; H01L 27/085; H01L 27/088
See application file for complete search history.

(56) References Cited

U.S. PATENT DOCUMENTS

| | | |
|---|---|---|
| 2014/0126087 A1 | 5/2014 | Hirose |
| 2015/0318242 A1 | 11/2015 | Li et al. |
| 2016/0293755 A1 | 10/2016 | Cai et al. |

FOREIGN PATENT DOCUMENTS

| | | |
|---|---|---|
| CN | 104157634 A | 11/2014 |
| CN | 105609493 A | 5/2016 |
| FR | 2916097 B1 | 5/2015 |

* cited by examiner

|  T1  |  T2  |
|------|------|
|  T2  |  T1  |
|  T1  |  T2  |

Fig.9

POWER CHIP AND BRIDGE CIRCUIT

CROSS REFERENCE

This application is based upon and claims priority to Chinese Patent Application No. 201610744165.9, filed on Aug. 26, 2016, the entire contents thereof are incorporated herein by reference.

TECHNICAL FIELD

The present disclosure relates to a power chip and a bridge circuit, and more particularly, to a power chip and a bridge circuit which may reduce a parasitic inductance.

BACKGROUND

With growth of people's demand for an intelligent lifestyle, demand for data processing is also growing. The global energy consumption in data processing has reached about hundreds of billions of or even trillions of kilowatts-hour each year, and a large data center can occupy an area up to tens of thousands of square meters. Accordingly, high efficiency and high power density are significant indicators of a healthy development of the data center industry.

A critical unit of the data center is a server, which is typically equipped with a mainboard composed of data processing chips (such as a CPU, chipsets, a memory or the like), power supplies thereof and necessary peripheral components. With increase of the processing capacity of a server, the number and the integration of the processing chips are also increasing, resulting in enlargement of the occupied space and increase of power consumption. Accordingly, the power supply (also referred to as a mainboard power supply since it is on the same mainboard as the data processing chips) for the chips is expected to have higher efficiency, higher power density and smaller volume, which is conducive to the energy saving and reduction of the occupied resource for the entire server or even of the entire data center.

SUMMARY

According to an aspect of the present disclosure, there is provided a power chip, including: a metal region; a wafer region; a first power switch, formed in the wafer region; and a second power switch, formed in the wafer region, wherein the first and second power switches are used as an upper bridge arm and a lower bridge arm of a bridge circuit, respectively, wherein at least one of the upper bridge arm and the lower bridge arm includes two or more power switches, which are coupled in parallel with each other; and the first and second power switches are staggered along at least one dimension direction.

According to an aspect of the present disclosure, there is provided a bridge circuit for reducing parasitic inductance, including:

a first power switch, forming a first bridge arm of the bridge circuit, wherein the first bridge arm has a first terminal and a second terminal;

a second power switch, forming a second bridge arm of the bridge circuit, wherein the second bridge arm is coupled with the first bridge arm in series and has a first terminal and a second terminal, and the first terminal of the second bridge arm is electrically coupled to the second terminal of the first bridge arm; and a capacitor, having a first end and a second end, wherein the first end of the capacitor is electrically coupled to the first terminal of the first bridge arm, and the second end of the capacitor is electrically coupled to the second terminal of the second bridge arm, wherein at least one of the first bridge arm and the second bridge arm includes two or more power switches which are coupled in parallel with each other, the first and second power switches are integrated in a power chip, and the first and second power switches are arranged alternatively along at least one dimension direction inside the power chip.

BRIEF DESCRIPTION OF THE DRAWINGS

FIG. 9 is a top view showing an arrangement of the power switches in a power chip according to another embodiment of the present disclosure;

DETAILED DESCRIPTION

Figure 1:
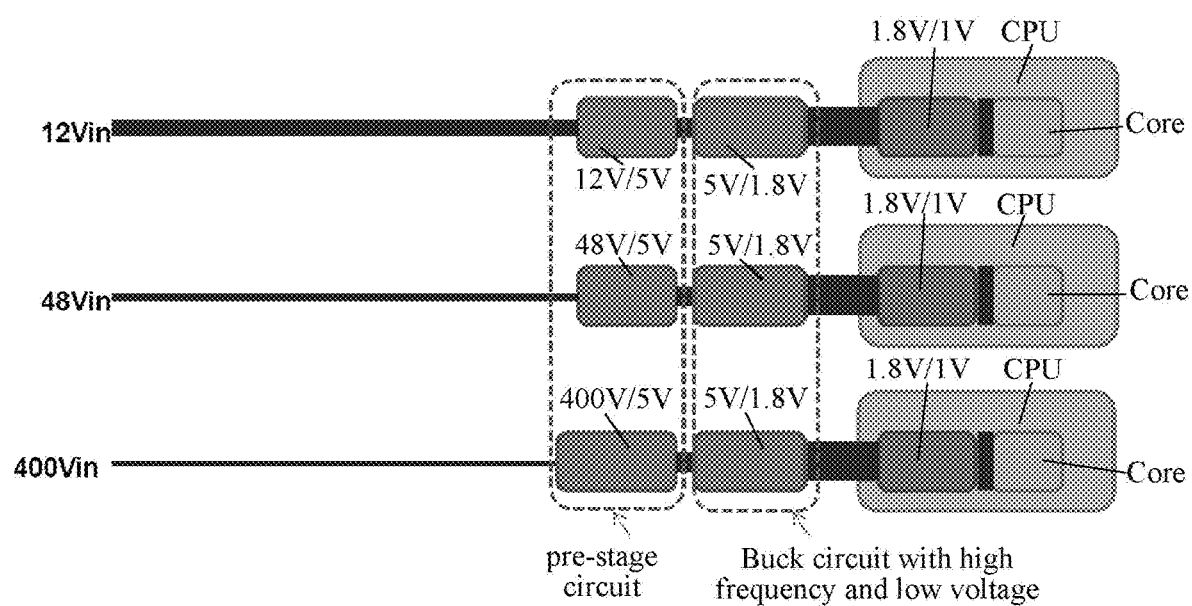
FIG. 1 is a schematic diagram of a circuit architecture of a low voltage Buck circuit converting 5V to 1.8V.

A number of different embodiments or examples are provided below, which are used to implement various features of the present disclosure. The following is a specific embodiment or example which discloses various elements and arrangements, to simplify description of the present disclosure. Of course, these are only examples, but not limited thereto. For example, in the description, a structure in which the first feature is located above the second feature may include a form that the first feature contacts directly with the second feature, and it may also include a form that an additional feature is inserted between the first feature and the second feature, such that the first feature and the second feature do not directly contact with each other. In addition, reference numerals and/or characters will be repeated in various examples of the present disclosure. The foregoing repetition is for the purpose of simplification and clarity, and not intended to specify relationships in various embodiments and/or configurations.

In addition, spatially related terms, such as "underlying", "below", "lower", "overlying", "upper", or the like are used herein to describe the relationship between one element or feature and another element or feature exemplified in the figures. The spatially related terms may include different orientations of the device in use or operation other than the orientation depicted in the figures. The device may be oriented (rotated 90 degrees or in other orientations) in other ways, and the spatially related descriptors used herein should be understood accordingly.

Figure 2:
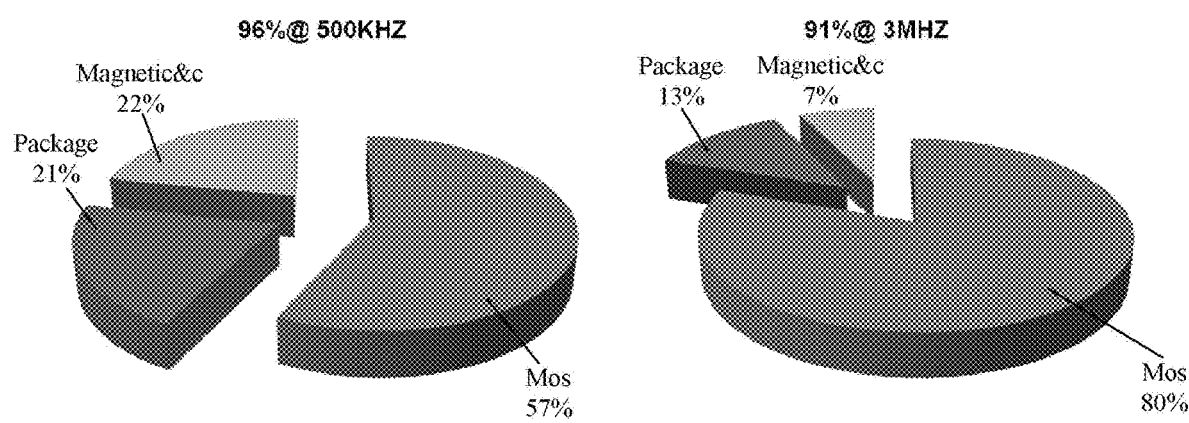
FIG. 2 is a schematic diagram of a loss percentage change of the power device depending on change of frequency in the Buck circuit.

In order to increase power density, for circuit architecture as shown in FIG. 1, there is a potential demand for a low voltage BUCK circuit(5V to 1.8V) to continuously increase work frequency. Meanwhile, high frequency may also improve dynamic response speed for a CPU load change. However, as shown in FIG. 2, it can be seen that, after arriving at high frequency, loss proportion of a power device MOS greatly increases, which becomes the main bottleneck of a high efficiency target.

Figure 3:
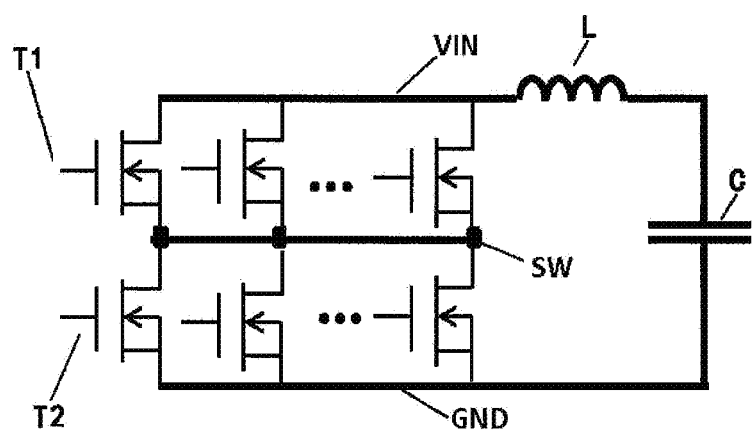
FIG. 3 is a schematic diagram of a bridge Buck circuit.
Figure 4:
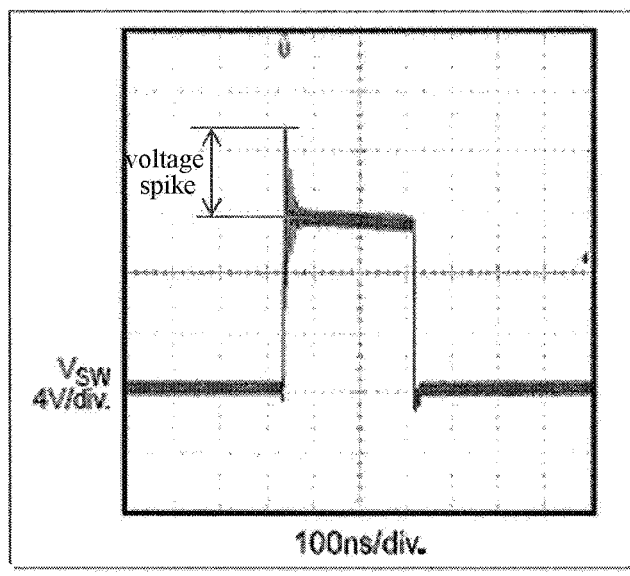
FIG. 4 is a schematic diagram of a voltage spike change across the power switch when the power switch in the bridge Buck circuit is turned off.
Figure 5:
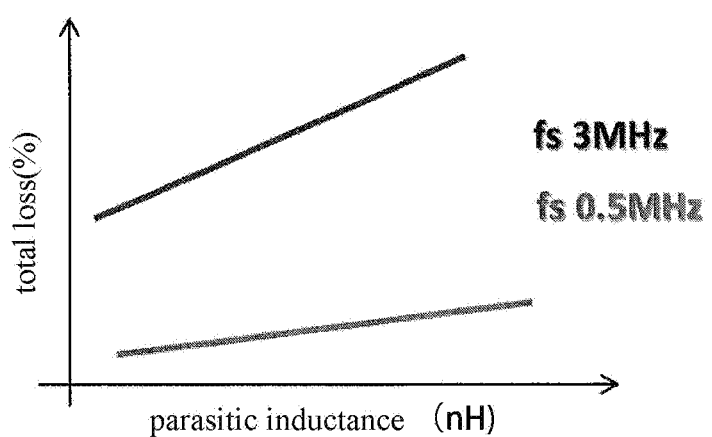
FIG. 5 is a schematic diagram of parasitic inductance and switch loss at different switch frequencies in the bridge Buck circuit.

Efficiency of the Buck circuit is related to the parasitic inductance of a commutation circuit loop. As shown in FIG. 3, an input capacitor C, a first power switch T1 and a second power switch T2 form a close-loop commutation circuit, wherein the first power switches T1 are coupled in parallel to form an upper bridge arm, and the second power switches T2 are coupled in parallel to form a lower bridge arm. The commutation circuit may present a certain parasitic inductance value at the moment that the first power switch is turned on or turned off. The equivalent position of the parasitic inductor in the commutation circuit is shown in FIG. 3. The smaller the parasitic inductance L of the commutation circuit is, the higher the efficiency of the Buck circuit will be, which is reflected in the following two aspects: 1) the smaller the parasitic inductance is, the smaller the voltage spike at two ends of the power switch when being turned off is, so a power switch with better performance and lower voltage may be employed, thus increasing efficiency of the Buck circuit, as shown in FIG. 4. 2) The smaller the parasitic inductance is, the smaller the switching loss is, thus increasing efficiency of the Buck circuit, as qualitatively shown in FIG. 5. When the switching frequency is higher, the parasitic inductance has more significant influence on the efficiency.

Figure 6:
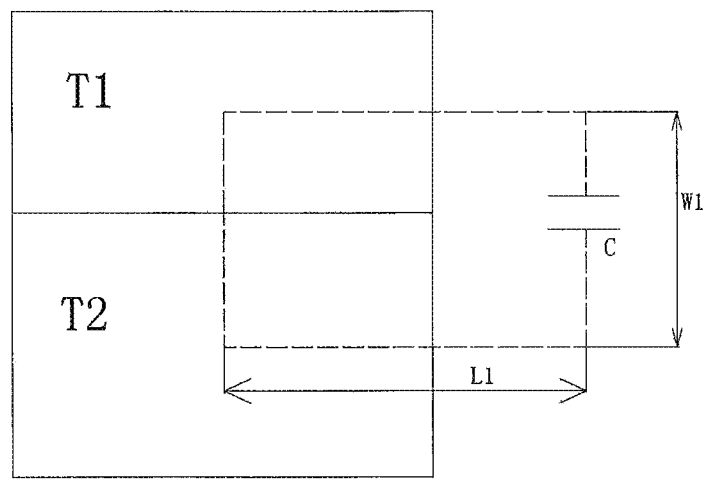
FIG. 6 is a schematic diagram of the first and second power switches being separately arranged in a power chip.

It can be seen that, in order to increase efficiency of the Buck circuit with high frequency and low voltage, it is important to reduce the parasitic inductance of the commutation circuit. In existing integrated chips, the first power chip T1 and the second power chip T2 are respectively separated as two regions, as shown in FIG. 6. In this case, a size of the equivalent high frequency commutation circuit loop is related to a geometrical center distance W1 between the first and second power switches T1 and T2 and a distance L between geometrical centers of the first and second power switches T1 and T2 and the input capacitor C. An area of the commutation circuit loop is W1*L1, which approximately equals to a quarter of an area of the power chip. Thus, the size of the high frequency commutation circuit loop is affected by the area of the power chip. On the other hand, the area of the power chip is determined by an optimal design under multiple factors considered, such as a power load and an optimal efficiency point, such that it is difficult to simultaneously reduce the size of the high frequency commutation circuit loop, which has a degree of inflexibility.

Figure 7:
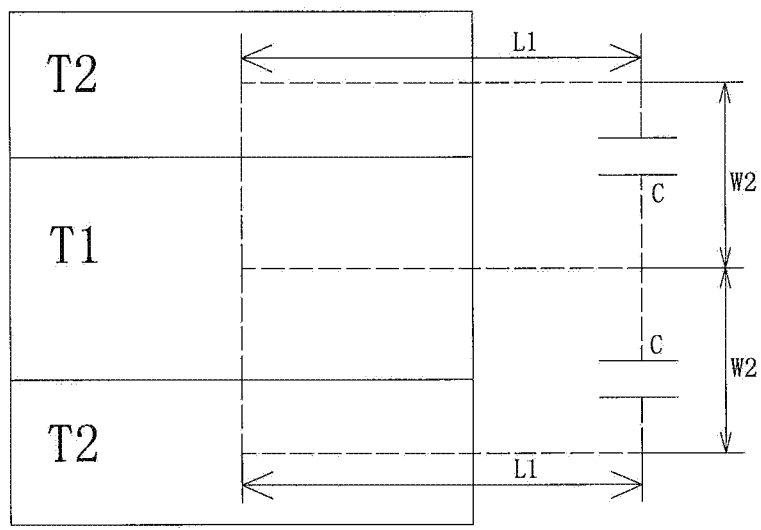
FIG. 7 is a top view showing the power switches arranged alternatively in a power chip according to an embodiment of the present disclosure.
Figure 10:
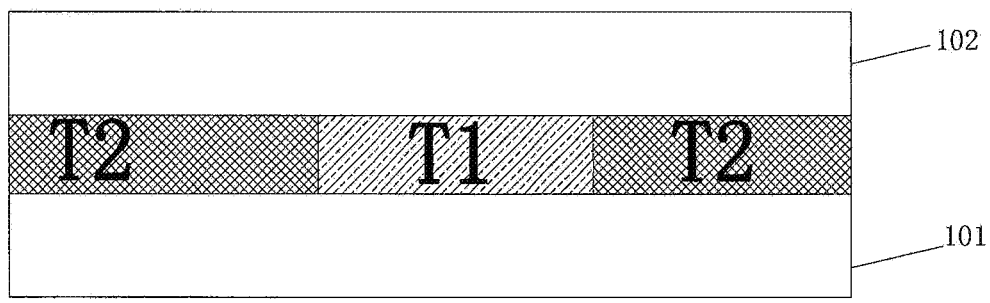
FIG. 10 is a sectional view showing a power chip according to an embodiment.

FIG. 7 is a top view showing an arrangement of the power switches in a power chip according to an embodiment of the present disclosure. As shown in FIG. 7 and FIG. 10, the power chip 10 includes a wafer region 101 and a metal region 102. The first and second power switches T1 and T2 are integrated in the wafer region 101.

Figure 9:
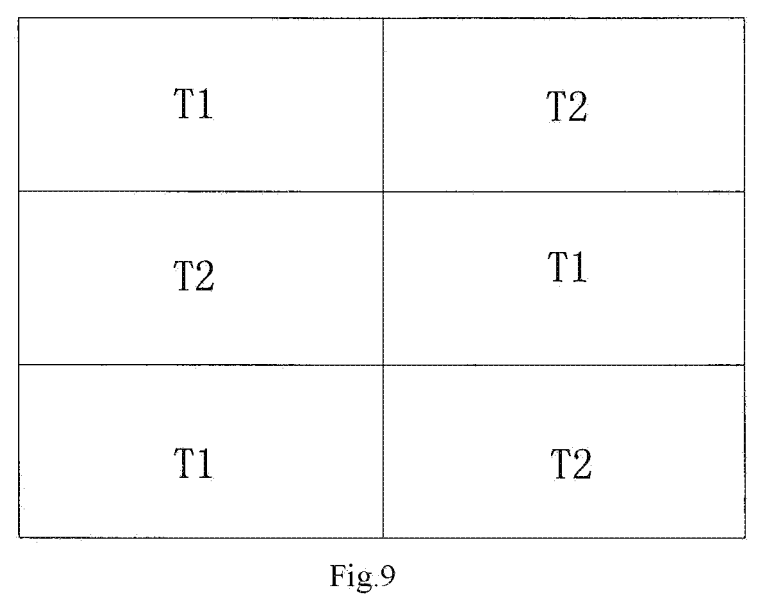

The first and second power switches T1 and T2 are integrated in the power chip 10, which are respectively used as an upper bridge arm and a lower bridge arm of a bridge circuit. In a structure, the first power switches T1 and the second power switch T2 may be disposed along at least one dimension direction. For example, the first and second power switches T1 and T2 may be arranged alternatively along a Y direction (a vertical direction). The arrangements of the first and second power switches T1 and T2 are not limited thereto. For example, the first and second power switches T1 and T2 may also be arranged alternatively along a X direction (a horizontal direction), or arranged alternatively along the X and Y directions as shown in FIG. 9. In the embodiment, the first power switch T1, the second power switch T2 and a capacitor C outside the power chip 10 are coupled to form a commutation circuit loop. The equivalent circuit is shown as FIG. 3. An region size of the commutation circuit loop is S2=W2*L1, wherein W2 represents a distance between geometrical centers of the first and second power switches T1 and T2, and L1 represents a distance between the geometrical centers of the power switches and the capacitor C.

Under the same area of the power chip, compared with the case as shown in FIG. 6 where the first and second power switches are separately arranged, the case in the present embodiment the first and second power switches are arranged alternatively may reduce the distance between the geometrical centers of the first and second power switches, i.e. W2<W1. When the distance L1 between the geometrical centers of the power switches and the capacitor is the same, the area of the commutation circuit loop correspondingly decreases, thus reducing the size of the commutation circuit loop, weakening the influence of the parasitic inductance, and improving efficiency of the power chip. In the present embodiment, the first and second power switches T1 and T2 are arranged alternatively for once, however, the times that the first and second power switches are arranged alternatively may vary depending on actual requirements. The more times the first and second power switches are arranged alternatively, the smaller the distance of the geometrical centers between the first and second power switches will be. The commutation circuit loop will be reduced correspondingly, which may further improve efficiency of the power chip.

Figure 8:
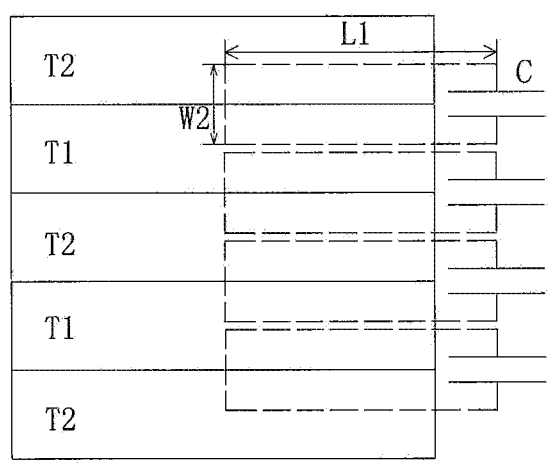
FIG. 8 is a top view showing the power switches arranged alternatively in a power chip according to another embodiment of the present disclosure.

FIG. 8 is a schematic plan diagram showing an arrangement of the power switches in a power chip according to another embodiment of the present disclosure. In the present embodiment, the first and second power switches are arranged alternatively for twice. The number of the first power switches is two, and the number of the second power switches is three. Under the same area of the power chip, the distance W3 between the geometrical centers of the first and second power switches in the present embodiment is smaller than W2, i.e. W3<W2, thus, the commutation circuit loop is smaller.

FIG. 9 is a schematic plan diagram showing an arrangement of the power switches in a power chip according to another embodiment of the present disclosure. Compared with the case as shown in FIGS. 7 and 8 where the first and second power switches are arranged alternatively along one direction, the first and second power switches in the present embodiment may be arranged alternatively along the X and Y directions.

FIG. 10 is a schematic sectional diagram showing a power chip according to an embodiment. As shown in FIG. 10, the first and second power switches T1 and T2 are integrated in the wafer region 101. Specifically, the first and second power switches T1 and T2 may be formed by doping on the substrate P. The metal region 102 is provided above the first and second power switches T1 and T2. The metal region has two functions: connecting a plurality of the first power switches T1 in parallel, connecting a plurality of the second power switches T2 in parallel, and connecting the parallel-connected first power switches and parallel-connected second power switches in series, by respectively coupling with the first and second power switches T1 and T2; and achieving connection of the driving circuit.

Figure 11:
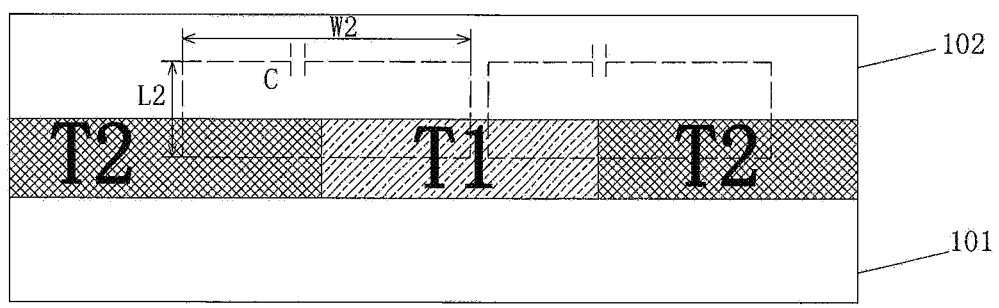
FIG. 11 is a sectional view showing a power chip in which a capacitor is provided in a metal region according to an embodiment.

In order to further reduce the size of the commutation circuit loop, the capacitor C may be disposed in the metal region 102. FIG. 11 is a schematic sectional diagram showing a power chip in which a capacitor is disposed in the metal region according to an embodiment. As shown in FIG. 11, when the capacitor C is in the metal region, a distance L2 between the capacitor C and the geometrical centers of the first and second power switches T1 and T2 corresponds to thicknesses of the metal region 102, the first and second power switches T1 and T2. The distance L2 is far smaller than the distance L1 between the geometrical centers of the power switches and the capacitor as shown in FIG. 7. In the present embodiment, an area of the commutation circuit loop S3 is equal to W2*L2. Since L2<L1, the area S3 of the commutation circuit loop in the present embodiment is smaller than the area S2 of the commutation circuit loop in the embodiment as shown in FIG. 7. Therefore, the influence of the parasitic inductance is greatly weakened, and efficiency of the power chip is improved.

Figure 12:
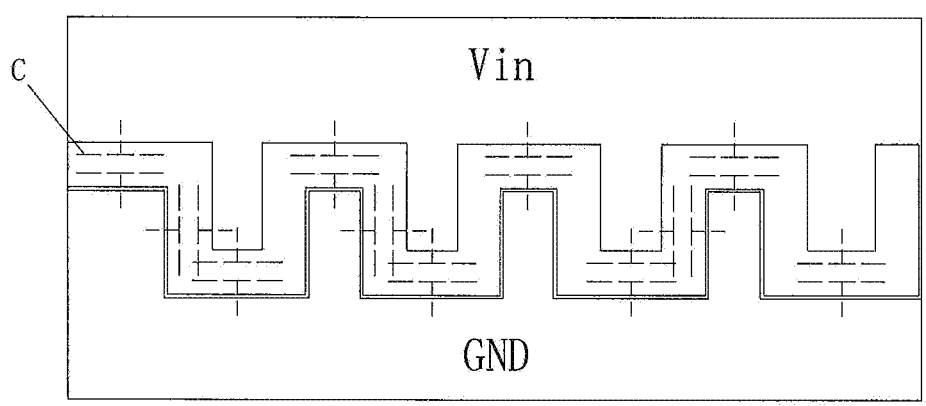
FIG. 12 is a sectional view showing a metal region of a power chip.

FIG. 12 is a schematic sectional diagram showing a metal region of a power chip. As shown in FIG. 12, the metal region 102 may include a first wiring layer M1 and a second wiring layer M2. The first wiring layer M1 is located above the first and second power switches T1 and T2, and forms a first pin GND through a metal lead. The second wiring layer M2 is located above the first wiring layer M1, and forms a second pin Vin through a metal lead. In the embodiment, the first wiring layer M1 and the second wiring layer M2 may be made of aluminium. Aluminium oxide in a honeycomb structure may be formed by anode oxidation between the first pin GND and the second pin Vin, such that a capacitor C is formed between the first pin GND and the second pin Vin. The first pin GND and the second pin Vin are coupled with the first and second power switches T1 and T2, respectively, such that the first power switch T1, the second power switch T2 and the capacitor C may form a closed commutation circuit loop. It should be noted that, the second wiring layer M2 is not limited to be located above the first wiring layer M1. The second wiring layer M2 may also be located below the first wiring layer M1.

Figure 13:
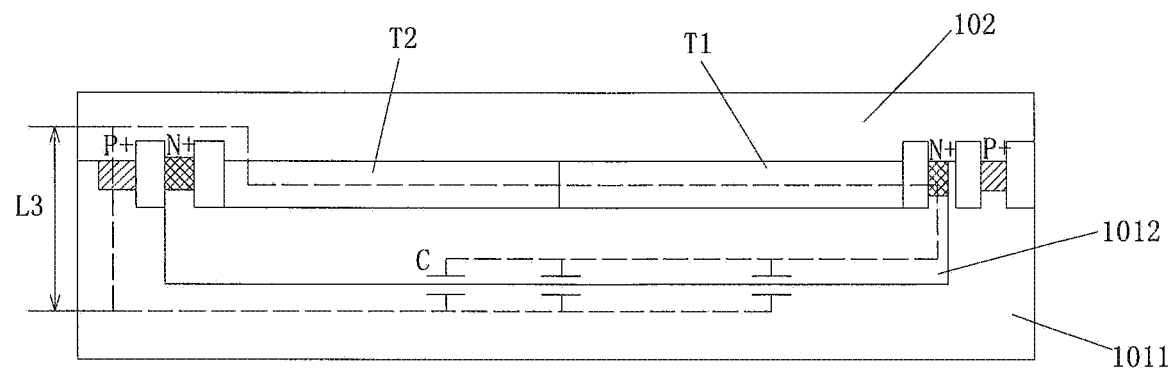
FIG. 13 is a sectional view showing a power chip according to another embodiment.

FIG. 13 is a schematic sectional diagram showing a power chip according to another embodiment. As shown in FIG. 13, the wafer region 101 includes a P type substrate layer 1011 and an N type insulating layer 1012. The N type insulating layer 1012 is disposed between the P type substrate layer 1011 and the first and second power switches T1 and T2. A junction capacitor is formed between the N type insulating layer 1012 and the P type substrate layer 1011, such that the capacitor C is disposed in the wafer region 101. The metal region 102 includes a first pin GND and the second pin Vin. In the present embodiment, the capacitor C has been disposed in the wafer region 101, thus it is unnecessary to conduct an anode oxidation treatment on the first pin GND and the second pin Vin. A wire electrode $N^+$ is needed to connect the N type insulating layer 1012 with the second pin Vin. A wire electrode $P^+$ is needed to connect the P type substrate layer 1011 with the first pin GND. In this way, two ends of the capacitor C formed in the wafer region 101 are respectively connected with the first and second power switches T1 and T2 through the metal region 102, thus forming a commutation circuit loop.

When the capacitor C is disposed in the metal region 101, a distance L3 between the capacitor C and the first and second power switches T1 and T2 corresponds to thicknesses of the wafer region 101, and the first and second power switches T1 and T2. The distance L3 is far smaller than the distance L1 between the geometrical centers of the power switches and the capacitor as shown in FIG. 7. In the present embodiment, an area of the commutation circuit loop S4 is equal to W2*L3. Since L3<L1, the area S4 of the commutation circuit loop in the present embodiment is smaller than the area S2 of the commutation circuit loop in the embodiment as shown in FIG. 7. Therefore, the influence of the parasitic inductance may be further weakened, and efficiency of the power chip may be improved.

Figure 14A:
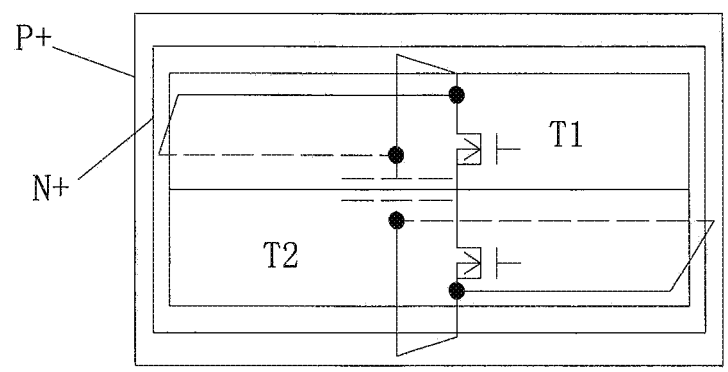
FIGS. 14a-14b and FIGS. 15a-15c are top view showing an arrangement of wire electrodes in a power chip.
Figure 14B:
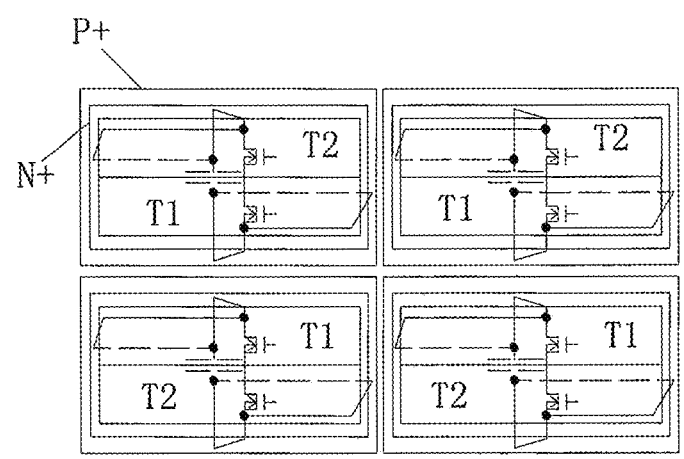
Figure 15A:
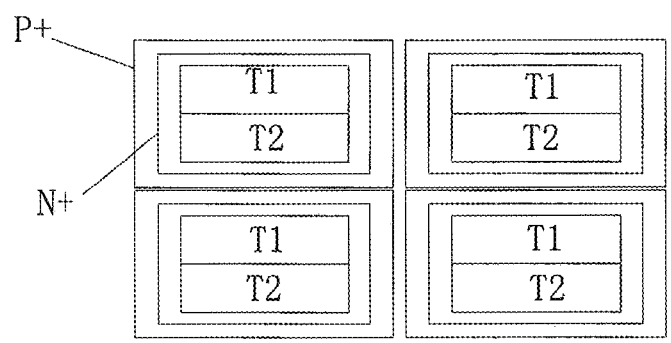
Figure 15B:
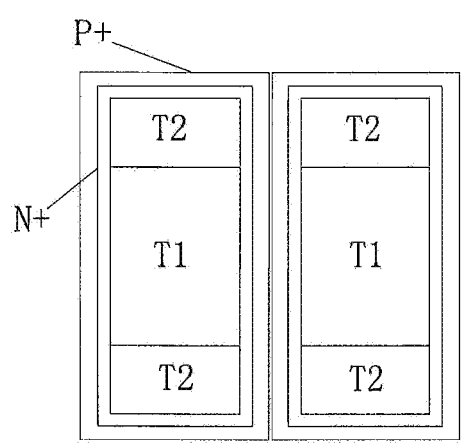
Figure 15C:
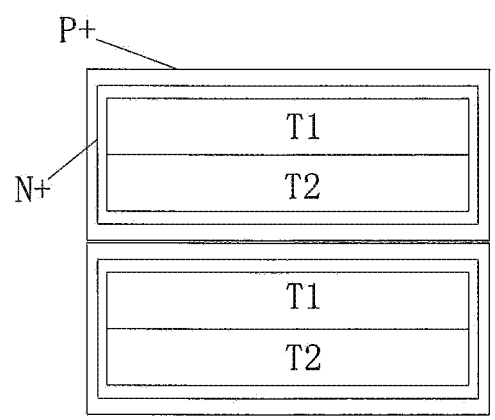

In addition, an arrangement manner of the wire electrodes $N^+$ and $P^+$ may influence the value of a parasitic resistance of the commutation circuit loop as shown in FIG. 13. The parasitic resistance of the commutation circuit loop mainly includes a parasitic resistance of the N type insulating layer, a parasitic resistance of the P type substrate layer, and a parasitic resistance of the metal region. The arrangement of the wire electrodes $N^+$ and $P^+$ usually presents a shape of closed rectangle frame on the top view, as shown in FIGS. 14a and 14b. Under the same area of the power chip, the more the power switches are partitioned by the wire electrode, the more the rectangle frames of the wire electrodes will be, and the smaller the parasitic resistance of the commutation circuit loop will be. The reasons are as follows: four rectangle frames of the wire electrodes are partitioned in FIG. 14b on the basis of FIG. 14a, so the parasitic resistance of the commutation circuit loop of the rectangle frame of each wire electrode in FIG. 14b is one fourth of the parasitic resistance of the commutation circuit loop of the rectangle frame of the wire electrode in FIG. 14a. Since the four rectangle frames of the wire electrodes are connected in parallel through the upper metal region, a total parasitic resistance of the commutation circuit loop after being connected in parallel in FIG. 14b is one sixteenth of the parasitic resistance of the commutation circuit loop in FIG. 14a. Combining with the characteristic that the first and second power switches are arranged alternatively, the arrangement of the wire electrodes may include the following three manners: 1) as shown in FIG. 15a, the power switches are partitioned by the wire electrodes of the capacitor both along a first direction that the power switches are arranged alternatively and a second direction perpendicular to the first direction; 2) as shown in FIG. 15b, the power switches are partitioned by the wire electrodes of the capacitor along a second direction perpendicular to the first direction that the power switches are arranged alternatively; and 3) as shown in FIG. 15c, the power switches are partitioned by the wire electrodes of the input capacitor along the first direction that the power switches are arranged alternatively.

Figure 16:
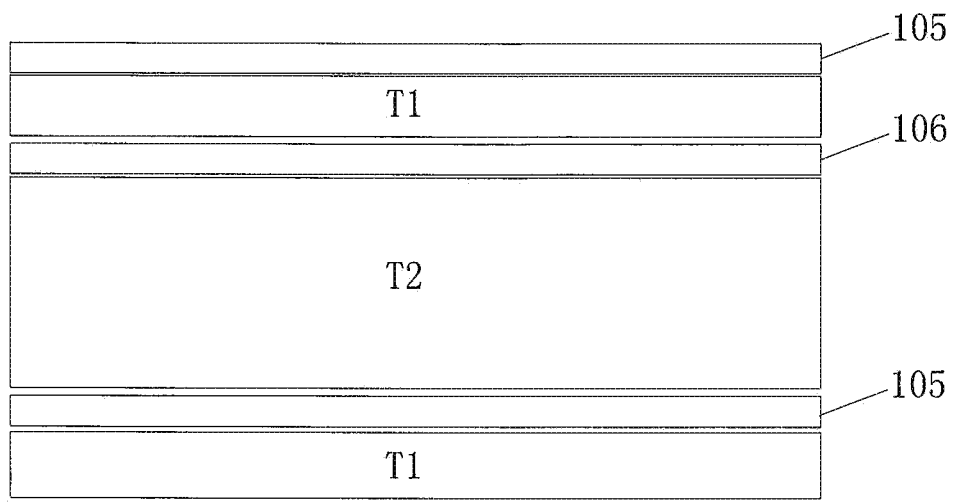
FIG. 16 is a top view showing a power chip according to another embodiment of the present disclosure.

FIG. 16 is a schematic plan diagram showing a power chip according to another embodiment of the present disclosure. Compared with the above embodiment, the power chip in the present embodiment further includes a first driving circuit 105 and a second driving circuit 106. The first driving circuit 105 is configured to turn on or turn off the first power switch T1. The second driving circuit 106 is configured to turn on or turn off the second power switch T2. In the embodiment, the first driving circuit 105 is closely adjacent to the first power switch T1 and configured in the same layer with the first power switch T1. The second driving circuit 106 is closely adjacent to the second power switch T2 and configured in the same layer with the second power switch T2. That is, the first driving circuit 105 and the second driving circuit 106 are arranged alternatively to correspond to the alternative arrangement of the first and second power switches T1 and T2. Since the driving circuit is disposed to be close and parallel to the power switch, a size of the driving circuit for turning on and off is reduced, and parasitic parameter of the driving circuit for turning on and off is reduced, and thereby reduces turn-off loss and achieves high efficiency performance under high frequency work condition.

Figure 17:
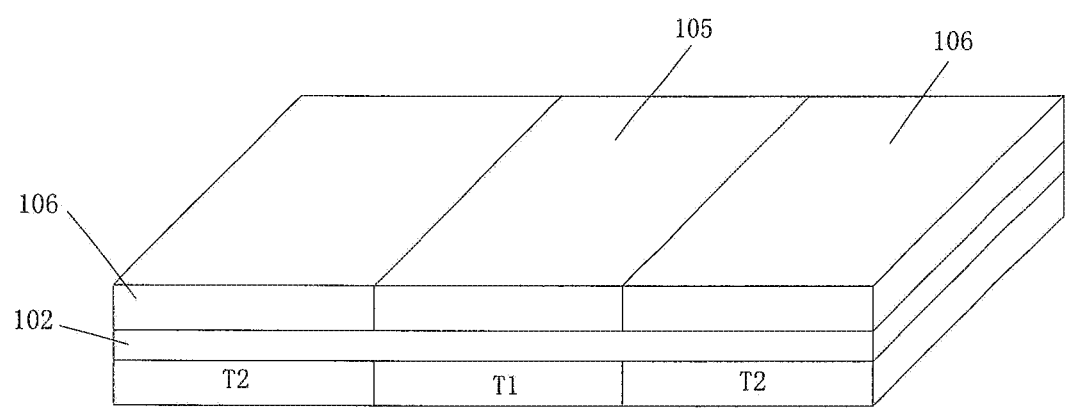
FIG. 17 is a perspective view showing a power chip according to another embodiment of the present disclosure.

FIG. 17 is a schematic perspective diagram showing a power chip according to another embodiment of the present disclosure. Compared with the embodiment as shown in FIG. 16, the first driving circuit 105 and the second driving circuit 106 in the present embodiment are disposed in the same layer with the power switch. On the contrary, the first driving circuit 105 and the second driving circuit 106 are disposed above the metal region 102. Furthermore, the first driving circuit 105 and the second driving circuit 106 are disposed directly above the corresponding first power switch T1 and the corresponding second power switch T2 thereof. By connecting the first driving circuit 105 and the first power switch T1 and connecting the second driving circuit 106 and the second power switch T2 through the metal region 102, a size of the turn-off driving circuit is reduced, and parasitic parameter of the turn-off driving circuit is reduced, and thereby reduces turn-off loss and achieves high efficiency performance under high frequency work condition.

In the above embodiments, the first power switch T1 includes a first terminal, a second terminal and a control terminal. The second power switch T2 includes a first terminal, a second terminal and a control terminal. For example, the first and second power switches T1 and T2 may be MOS(Metal Oxide Semiconductor) transistors, including a source electrode, a drain electrode and a gate electrode. However, a type of the first and second power switches in the present disclosure is not limited thereto. Both the first and second power switches T1 and T2 are lateral type power devices. For lateral type, both the source electrode and the drain electrode of the first power device T1 are disposed on an upper surface of the first power device T1 so as to connect with the first pin GND and the second pin Vin in the metal region 102 and closely arrange the capacitor, to reduce the size of the commutation circuit loop.

Figure 18:
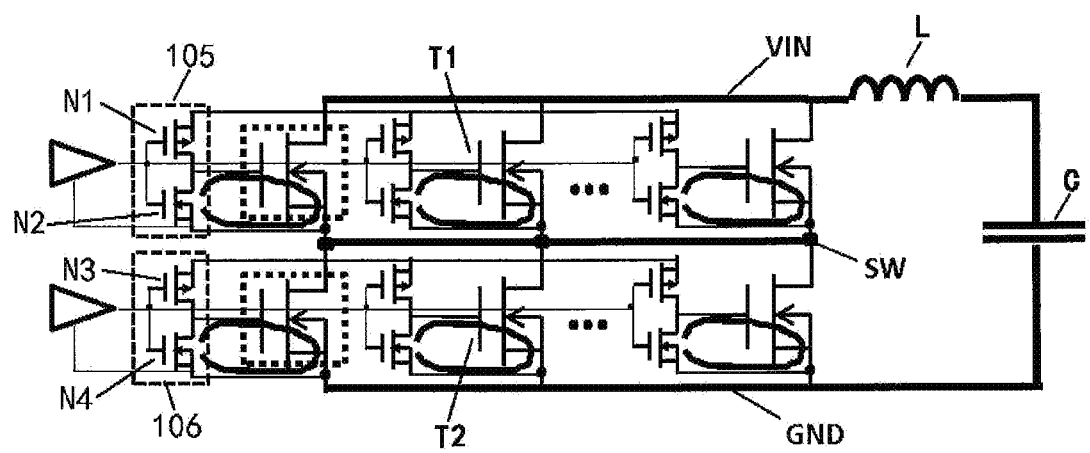
FIG. 18 is a schematic circuit showing a driving circuit in a power chip according to an embodiment of the present disclosure.

FIG. 18 shows a schematic circuit diagram of a driving circuit in a power chip according to an embodiment of the present disclosure. As shown in FIG. 18, the first driving circuit 105 includes a third switch N1 and a fourth switch N2. For example, the third switch N1 and the fourth switch N2 may be MOS transistors. However, the present disclosure is not limited thereto. A source electrode of the third switch N1 is connected to a drain electrode of the fourth switch N2 and a gate electrode of the first power switch T1. A source electrode of the fourth switch N2 is connected to a source electrode of the first power switch T1. The second driving circuit 106 includes a fifth switch N3 and a sixth switch N4. For example, the fifth switch N3 and the sixth switch N4 may be MOS transistors. However, the present disclosure is not limited thereto. A source electrode of the fifth switch N3 is connected to a drain electrode of the sixth switch N4 and a grate electrode of the second power switch T2. A source electrode of the sixth switch N4 is connected to a source electrode of the second power switch T2.

Figure 19:
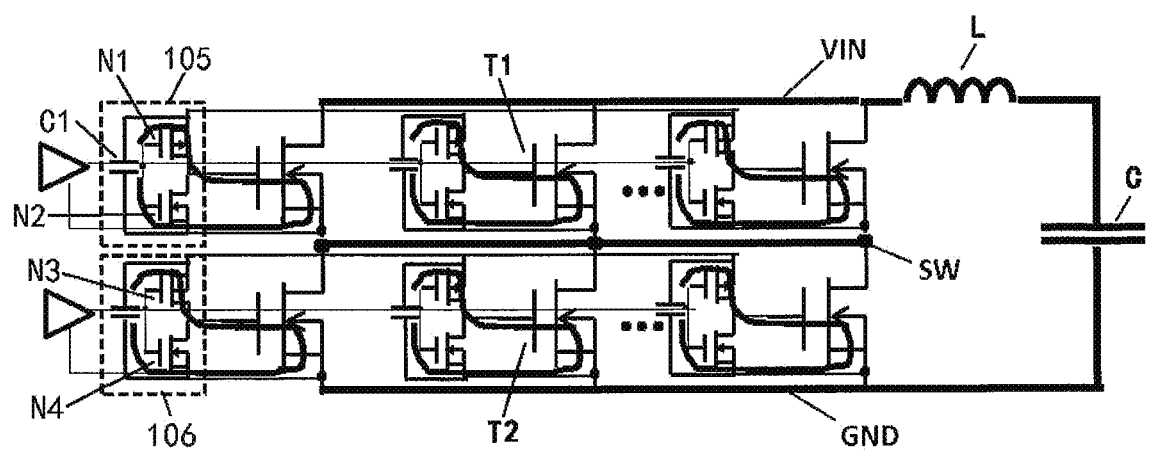
FIG. 19 is a schematic circuit showing a driving circuit in a power chip according to another embodiment of the present disclosure.

The first driving circuit 105 and the second driving circuit 106 as shown in FIGS. 16 and 17 may further include a driving capacitor, and a schematic circuit diagram thereof is shown in FIG. 19.

FIG. 19 is a schematic diagram showing a driving circuit in a power chip according to embodiment of the present disclosure. Compared with the first driving circuit and the second driving circuit as shown in FIG. 18, a driving capacitor C1 is added in the driving circuit in the present embodiment. One terminal of the driving capacitor C1 in the first driving circuit 105 is connected to the drain electrode of the third switch N1, and the other terminal of the driving capacitor C1 in the first driving circuit 105 is connected to the source electrode of the fourth switch N2. Similarly, one terminal of the driving capacitor C1 in the second driving circuit 106 is connected to the drain electrode of the fifth switch N3, and the other terminal of the driving capacitor C1 in the second driving circuit 106 is connected to the source electrode of the sixth switch N4. In the present embodiment, the driving capacitor is disposed in the driving circuit, so that the driving circuit is closer to the power switch, thus reducing the size of the turn-on driving circuit.

A bridge circuit including a first power switch T1, a second power switch T2 and a capacitor C is also provided in an embodiment of the present disclosure. For example, the first power switches T1 are connected in parallel to form a first bridge arm. The first bridge arm has a first terminal and a second terminal. The second power switches T2 are connected in parallel to form a second bridge arm. The second bridge arm is connected in series with the first bridge arm and has a first terminal and a second terminal. The first terminal of the second bridge arm is electrically coupled to the second terminal of the first bridge arm. The capacitor C has a first end and a second end, the first end of the capacitor C is coupled to the first terminal of the first bridge arm, and the second end of the capacitor C is coupled to the second terminal of the second bridge arm. In the embodiment, the first and second power switches T1 and T2 are integrated in the power chip as shown in the above embodiments. Furthermore, the first and second power switches T1 and T2 inside the power chip are arranged alternatively along at least one dimension direction as shown in the above embodiments. In addition, in other embodiments, there is a single first power switch T1, and there are two or more second power switches T2. Otherwise, there are two or more first power switches T1, and there is a single second power switch T2. The arrangement manner of the first and second power switches T1 and T2 has been illustrated in detail in the above embodiments of the power chip, which will not be repeated herein.

In the present embodiment, the first and second power switches inside the power chip are arranged alternatively, which may reduce parasitic inductance value of an equivalent commutation circuit loop of a Buck circuit, thereby ensuring high efficiency and high power density of the power supply.

Although the above implementation has disclosed specific embodiments of the present disclosure, it does not limit the present disclosure. Those skilled in the art may make various variation and modification without departing from the scope and sprit of the present disclosure. The protection scope of the present disclosure is subject to the scope defined by the claims.

What is claimed is:

1. A power chip, comprising:
   a metal region;
   a wafer region;
   at least one first power switch, formed in the wafer region; and
   at least one second power switch, formed in the wafer region, wherein the first power switch is used as an upper bridge arm of a bridge circuit and the second power switch is used as a lower bridge arm of the bridge circuit, respectively, and wherein the bridge circuit consists of the upper bridge arm and the lower bridge arm, the bridge circuit has a first pin, a second pin and a midpoint, the upper bridge arm is connected between the first pin and the midpoint, and the lower bridge arm is connected between the midpoint and the second pin,
   wherein at least one of the upper bridge arm and the lower bridge arm of the bridge circuit comprises at least two power switches that are coupled in parallel with each other, and
   wherein,
   in case the upper bridge arm of the bridge circuit comprises at least two first power switches that are coupled in parallel between the first pin and the midpoint, the at least two first power switches and at least one second power switch of the lower bridge arm of the bridge circuit in the power chip are arranged alternatively along at least one dimension direction, and
   in case the lower bridge arm of the bridge circuit comprises at least two second power switches that are coupled in parallel between the midpoint and the second pin, the at least two second power switches and at least one first power switch of the upper bridge arm of the bridge circuit in the power chip are arranged alternatively along at least one dimension direction.

2. The power chip according to claim 1, wherein the first and second power switches are arranged alternatively along a horizontal direction.

3. The power chip according to claim 1, wherein the first and second power switches are arranged alternatively along a horizontal direction and a perpendicular direction.

4. The power chip according to claim 1, further comprising:
   a capacitor, disposed in the metal region, wherein the capacitor, the upper bridge arm and the lower bridge arm form a commutation circuit loop.

5. The power chip according to claim 4, wherein the metal region comprises:
   a first wiring layer, located above the first and second power switches, and configured to form a first pin through a metal lead; and
   a second connection layer, located above or below the first connection layer, and configured to form a second pin through a metal lead,
   wherein the capacitor is formed between the first wiring layer and the second wiring layer by an anode oxidation process.

6. The power chip according to claim 1, further comprising:
   a capacitor, disposed in the wafer region, wherein the capacitor, the upper bridge arm and the lower bridge arm form a commutation circuit loop.

7. The power chip according to claim 6, wherein the wafer region comprises:
   a N type insulating layer, disposed between a P type substrate layer and the first and second power switches, and two ends of a junction capacitor between the N type insulating layer and the P type substrate layer are respectively coupled to a second pin and a first pin through metal leads.

8. The power chip according to claim 7, wherein the N type insulating layer is coupled to the second pin through a wire electrode $N^+$, and the P type substrate layer is coupled to the first pin through a wire electrode $P^+$.

9. The power chip according to claim 1, further comprising:
   a first driving circuit, configured to be closely adjacent to the first power switch; and
   a second driving circuit, configured to be closely adjacent to the second power switch,
   wherein the first driving circuit and the second driving circuit are arranged alternatively to correspond to the alternative arrangement of the first and second power switches.

10. The power chip according to claim 9, wherein both the first driving circuit and the second driving circuit further comprise a driving capacitor.

11. The power chip according to claim 1, wherein both the first and second power switches are lateral type power devices.

12. The power chip according to claim 11, wherein each of the first and second power switches comprises a source electrode and a drain electrode, and the source electrode and the drain electrode are located at the same side of the power chip.

13. A bridge circuit for reducing parasitic inductance, comprising:
    at least one first power switch, forming a first bridge arm of the bridge circuit, wherein the first bridge arm has a first terminal and a second terminal;
    at least one second power switch, forming a second bridge arm of the bridge circuit, wherein the second bridge arm is coupled with the first bridge arm in series and has a first terminal and a second terminal, and the first terminal of the second bridge arm is electrically coupled to the second terminal of the first bridge arm, and wherein the bridge circuit consists of the first bridge arm and the second bridge arm, the bridge circuit has a first pin, a second pin and a midpoint, the first bridge arm is connected between the first pin and the midpoint, and the second bridge arm is connected between the midpoint and the second pin; and
    a capacitor, having a first end and a second end, wherein the first end of the capacitor is electrically coupled to the first terminal of the first bridge arm, and the second end of the capacitor is electrically coupled to the second terminal of the second bridge arm,
    wherein at least one of the first bridge arm and the second bridge arm of the bridge circuit comprises at least two power switches that are coupled in parallel with each other, the first and second power switches of the bridge circuit are integrated in a power chip, and wherein, in case the first bridge arm of the bridge circuit comprises at least two first power switches that are coupled in parallel between the first pin and the midpoint, the at least two first power switches and at least one second power switch of the second bridge arm of the bridge circuit in the power chip are arranged alternatively along at least one dimension direction, and in case the second bridge arm of the bridge circuit comprises at least two second power switches that are coupled in parallel between the midpoint and the second pin, the at least two second power switches and at least one first power switch of the first bridge arm of the bridge circuit in the power chip are arranged alternatively along at least one dimension direction inside the power chip.

14. The bridge circuit according to claim 13, wherein the power chip comprises a metal region and a wafer region, and the first and second power switches are disposed in the wafer region of the power chip.

15. The bridge circuit according to claim 14, wherein the first and second power switches are arranged alternatively along a horizontal direction.

16. The bridge circuit according to claim 14, wherein the first and second power switches are arranged alternatively along a horizontal direction and a perpendicular direction.

17. The bridge circuit according to claim 14, wherein the capacitor is integrated in the metal region of the power chip, and the capacitor together with the first bridge arm and the second bridge arm form a commutation circuit loop.

18. The bridge circuit according to claim 17, wherein the metal region comprises:
- a first wiring layer, located above the first and second power switches, and configured to form a first pin through a metal lead; and
- a second connection layer, located above or below the first connection layer, and configured to form a second pin through a metal lead, wherein the capacitor is formed between the first connection layer and the second connection layer by anode oxidation process.

19. The bridge circuit according to claim 14, wherein the capacitor is integrated in the wafer region of the power chip, and the capacitor forms a commutation circuit loop together with the first bridge arm and the second bridge arm.

20. The bridge circuit according to claim 13, further comprising:
- a first driving circuit, configured to be closely adjacent to the first power switch, and driving the first power switch to turn on or turn off; and
- a second driving circuit, configured to be closely adjacent to the second power switch, and driving the second power switch to turn on or turn off, wherein the first driving circuit and the second driving circuit are arranged alternatively to correspond to the alternative arrangement of the first and second power switches.

* * * * *